(12) United States Patent
Samaniego et al.

(10) Patent No.: US 7,508,676 B1
(45) Date of Patent: Mar. 24, 2009

(54) COLD PLATE STRUCTURE AND METHOD FOR COOLING PLANAR ARRAYS OF PROCESSORS DURING ASSEMBLY AND TEST ALLOWING FOR SINGLE MODULE SITE REWORKABILITY

(75) Inventors: Paul Samaniego, Port Ewen, NY (US); Levi Campbell, Poughkeepsie, NY (US); Michael Ellsworth, Jr., Lagrangeville, NY (US); Michael Domitrovits, New Paltz, NY (US); Paul Kelley, Dripping Springs, TX (US); Howard Mahaney, Jr., Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/101,284

(22) Filed: Apr. 11, 2008

(51) Int. Cl.
  *H05K 7/20* (2006.01)
  *H05K 7/00* (2006.01)
  *F28F 7/00* (2006.01)
  *H01L 23/34* (2006.01)

(52) U.S. Cl. .................. 361/728; 361/715; 361/716; 361/729; 174/15.1; 165/80.4; 257/714

(58) Field of Classification Search ......... 361/715–716, 361/728–729; 174/15.1; 165/80.4; 257/714
See application file for complete search history.

(56) References Cited

U.S. PATENT DOCUMENTS

| | | | |
|---|---|---|---|
| 3,946,276 A * | 3/1976 | Braun et al. | 361/699 |
| 4,500,945 A * | 2/1985 | Lipschutz | 361/715 |
| 4,748,495 A * | 5/1988 | Kucharek | 257/713 |
| 4,765,400 A * | 8/1988 | Chu et al. | 165/185 |
| 4,791,983 A * | 12/1988 | Nicol et al. | 165/80.4 |
| 4,809,134 A * | 2/1989 | Tustaniwskyj et al. | 361/699 |
| 4,884,167 A * | 11/1989 | Mine | 361/702 |
| 5,131,859 A | 7/1992 | Bowen et al. | |
| 5,329,419 A * | 7/1994 | Umezawa | 361/699 |
| 6,065,208 A * | 5/2000 | Lamb et al. | 29/890.03 |
| 6,173,760 B1 * | 1/2001 | Gardell et al. | 165/80.4 |
| 6,760,221 B2 * | 7/2004 | Goth et al. | 361/699 |
| 7,187,549 B2 * | 3/2007 | Teneketges et al. | 361/699 |
| 7,272,006 B2 * | 9/2007 | Mongia et al. | 361/702 |
| 7,325,588 B2 | 2/2008 | Malone et al. | |
| 2005/0128705 A1 * | 6/2005 | Chu et al. | 361/699 |
| 2006/0002086 A1 * | 1/2006 | Teneketges et al. | 361/699 |
| 2006/0060328 A1 * | 3/2006 | Ewes et al. | 165/80.2 |

* cited by examiner

*Primary Examiner*—Jayprakash N Gandhi
*Assistant Examiner*—Bradley H Thomas
(74) *Attorney, Agent, or Firm*—The Law Firm of Andrea Hence Evans, LLC

(57) ABSTRACT

A method of cooling a module attached to a board by a spring mechanism that provides access to the module during testing. A cold plate assembly features a dry thermal interface coupled with spring loaded plunger to ensure a module, such as a dual chip module (DCM), for example, remains in place during individual cold plate removal.

1 Claim, 4 Drawing Sheets

COLD PLATE STRUCTURE AND METHOD FOR COOLING PLANAR ARRAYS OF PROCESSORS DURING ASSEMBLY AND TEST ALLOWING FOR SINGLE MODULE SITE REWORKABILITY

FIELD OF THE INVENTION

The present invention generally relates to cooling systems and in particular, a cold plate assembly with flexible tubing that provides access to the modules during reworkability.

BACKGROUND OF THE INVENTION

A module is a microprocessor and its associated memory chip(s) and passive components, the substrate to which these components are mechanically and electrically affixed, and the lid which is mechanically and thermally coupled to the opposing sides of the components and onto the upper side of the substrate. On a server's main electronics board, there may be one or several locations where modules are to be placed, each location is then referred to as a module site.

Modules generate a significant amount of heat during testing. The heat must be removed in order to avoid thermal damage of the module. Conventionally, a cold plate manifold is provided to aid in the removal of heat. A conventional production level liquid cooled cold plate manifold has rigid copper tubes in four parallel cooling loops. These four loops each service four module sites. The coolant is supplied via a single supply and exhausted via a single return. Since there are multiple electronics modules to be cooled, the coolant is routed via tubing to multiple locations- the multiple tubes meet the supply and return at their respective manifolds. The liquid flows through a quadrant rather than an individual site. Each loop is rigidly attached to the four cold plates and the supply header by a brazing process. The module fixture is attached to the cold plate manifold. To gain access to one site the entire copper pipe manifold and sixteen cold plates need to be removed as one entity. Each node will require several iterative cold plate removals which are costly and time consuming.

Furthermore, the manifold interfaces with the module with a grease to improve thermal conductivity between the module and cold plate. This grease secures the module physically to the cold plates. The grease interface disrupts all module to planar board connections.

SUMMARY OF THE INVENTION

The present invention introduces an embodiment of a cold plate assembly with flexible tubing which allows the cold plate assembly to function as a single cold plate rather than a rigid assembly. This enables the manufacturing line to perform single site rework, improving test cycle time and overall productivity. The cold plate assembly features a dry thermal interface coupled with spring loaded plunger to ensure a module, such as a dual chip module (DCM), for example, remains in place during individual cold plate removal.

DETAILED DESCRIPTION OF THE INVENTION

Figure 1:
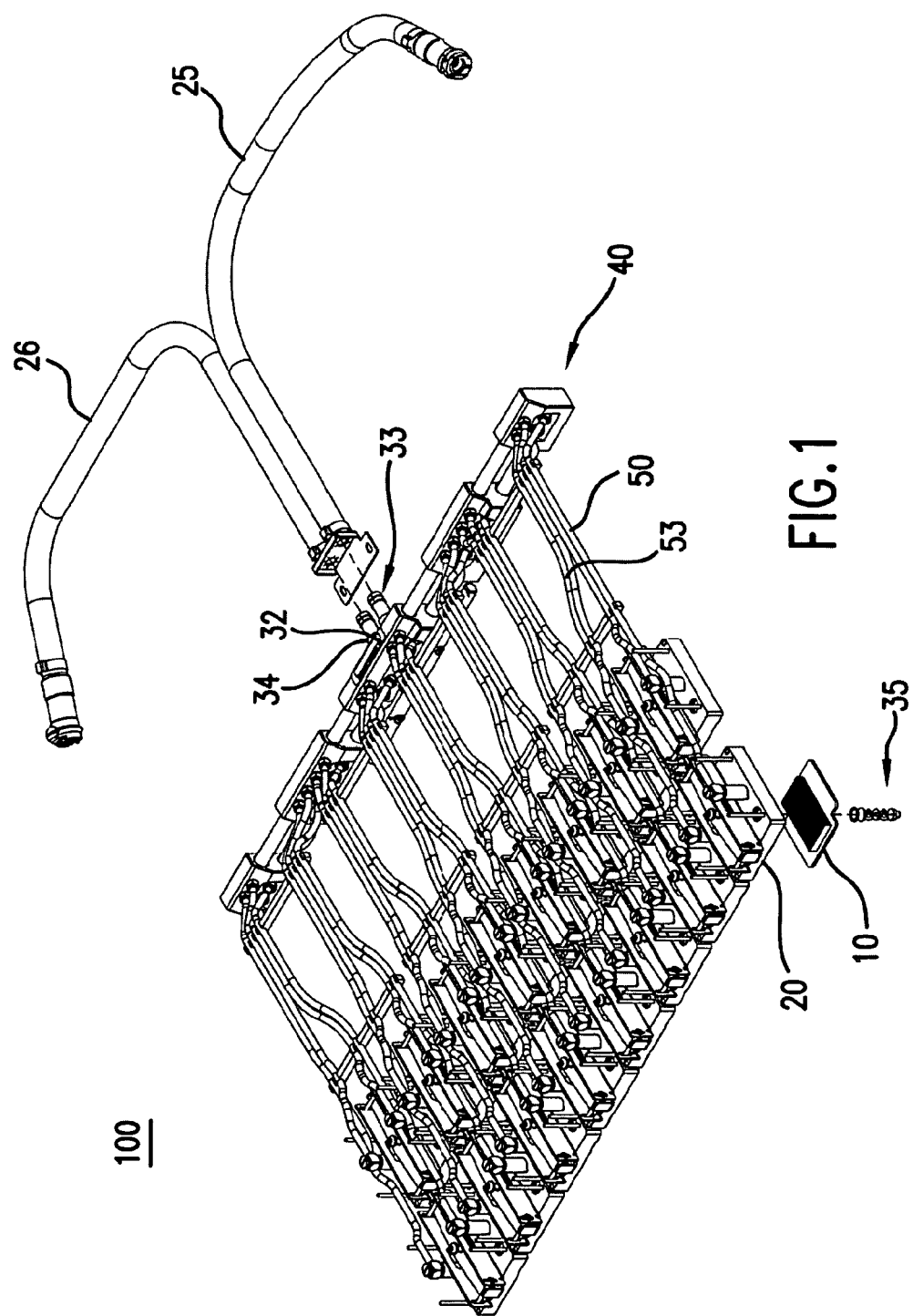
FIG. 1 is a perspective view of the cold plate assembly of an embodiment of the invention.

FIG. 1 is a perspective view of a cold plate assembly 100 of an embodiment of the invention. The cold plate assembly features sixteen cold plates 20. The board has multiple modules to be cooled and the cold plate assembly has multiple cold plates coupled to a common manifold. One cold plate can be removed from its respective module without disturbing the location of the manifold, other cold plates, or any of the modules.

For illustration purposes, an individual cold plate 20 will be discussed. Element 10 illustrates the base plate of the cold plate. The sixteen cold plates are identical in structure and function in an embodiment of the invention. The hose assembly features a left hose 25 and right hose 26. The hoses are inserted into the fitting 33 which are connected to the manifold 40 and the cold fluid entry 32 and the hot fluid exit 34. Tubes 50 and 53 are connected to the manifold and the cold plate 20. The tubes 50 and 53 transport the fluid to the cold plate to provide cooling to the module in contact with the cold plate 20. The inlet temperature of each module is variable and independent of the ambient air temperature, allowing great testing flexibility. If a module fails, an embodiment of the invention provides single site rework. Since the liquid flows to an individual cold plate, if the module fails the remaining cold plates do not have to be disconnected or removed to provide access to the module that requires removal.

Figure 2:
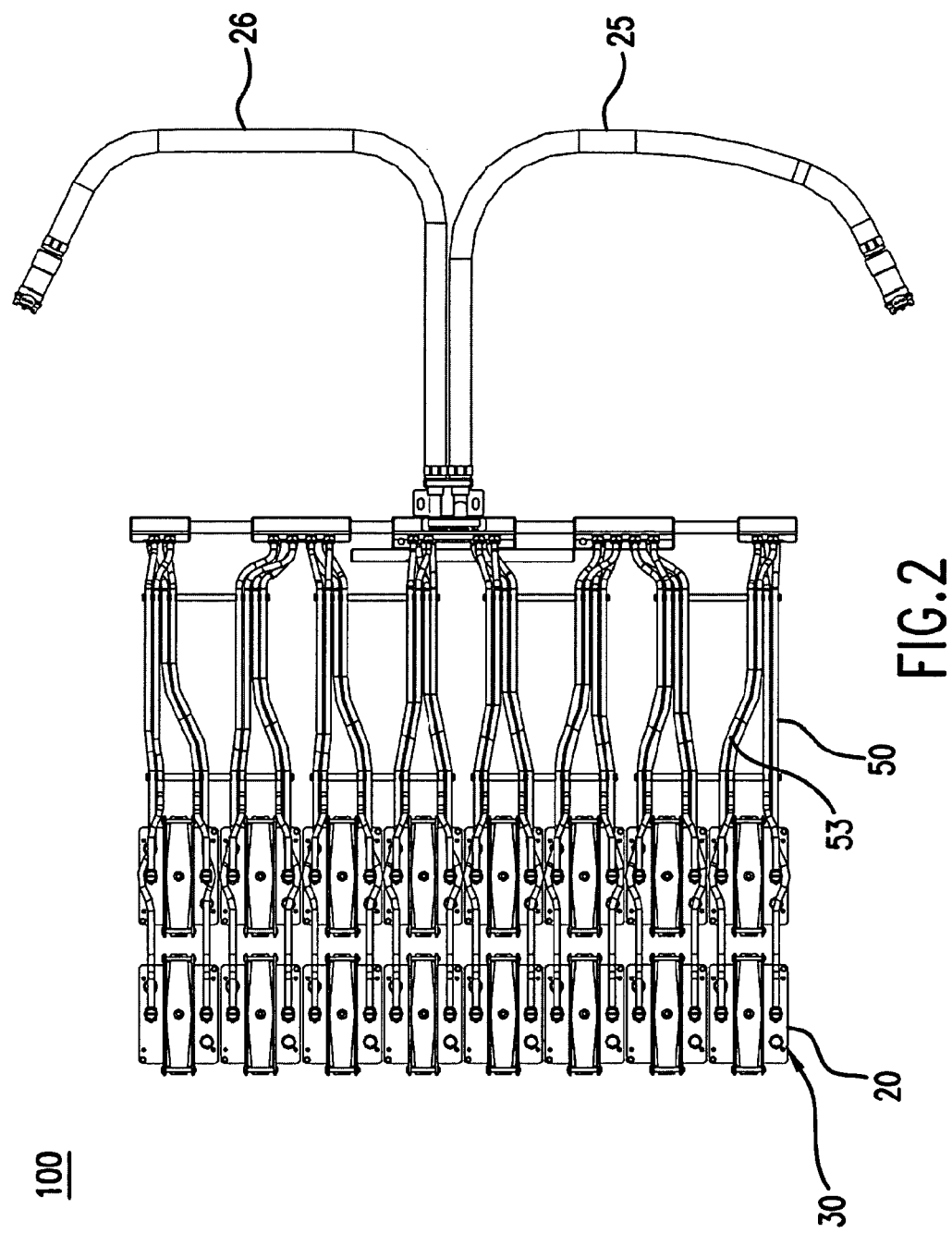
FIG. 2 is a top view of the cold plate assembly of an embodiment of the invention.

FIG. 2 is a top view of the cold plate assembly 100 of an embodiment of the invention. The inlet and outlet tubes 50 and 53 provide fluid to the cold plate 20. The tubes can be assembled in a node view alternatively. The top view of the spring mechanism 30 is shown.

Figure 3:
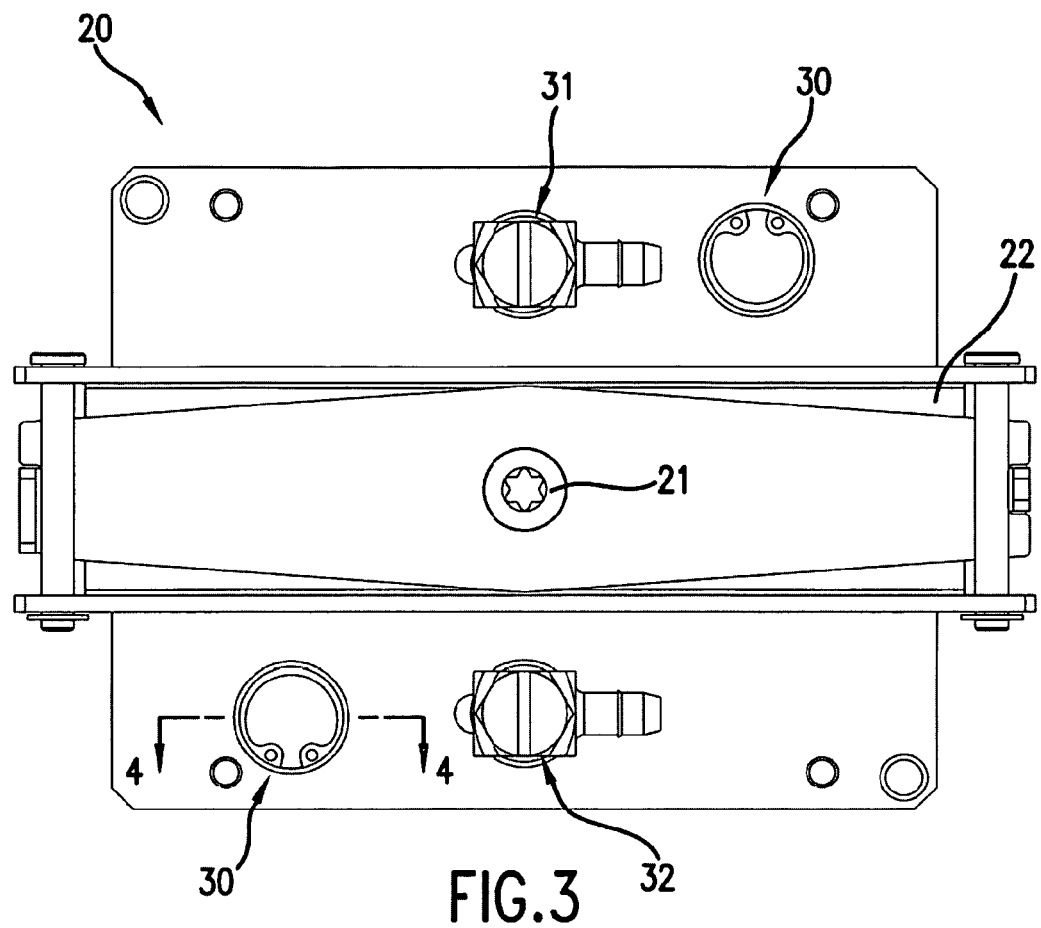
FIG. 3 is a top view of an individual cold plate of an embodiment of the invention.

FIG. 3 is a top view of an individual cold plate 20 of an embodiment of the invention. A single site rework is accomplished by decoupling the cold plate 20 from the module. To decouple the cold plate, an actuation screw 21 is loosened to relieve tension on an outer spring 22 which applies a compressive force between the cold plate 20 and the module. Although the single cold plate 20 is removed, the manifold 40 remains fluidically coupled to the cold plate 20 via the tubes 50 and 53 and allows access to the module (not shown). Furthermore, the remaining cold plates and modules remain untouched.

The tubes are fitted through barbed fittings 31 and 32 which serve as inlet and outlets for the tubes. Fitting 31 may serve as an inlet and fitting 32 may serve as an outlet, or vice versa depending on how the user desires to connect the tubes. If an error occurs during testing or the user desires to remove the module, the module is removed from the board and replaced with a different module. Then, the cold plate 20 is placed back in position and coupled via the outer spring 22. The outer spring 22 is a two piece leaf spring. As the screw 21 is tightened, the outer spring 22 puts a force onto the cold plate 20 and the cold plate 20 contacts the module to dissipate heat. The cold plate 20 contacts the module on its interface side, which is the side opposite the fluid connecting side. The interface side is prepared with a dry thermal interface material, such as a graphite pad 41, which in turn is in contact with the interface surface of the lid of the module to be cooled. A spring mechanism 30 prevents the module from adhering to the cold plate when the cold plate is decoupled.

Figure 4:
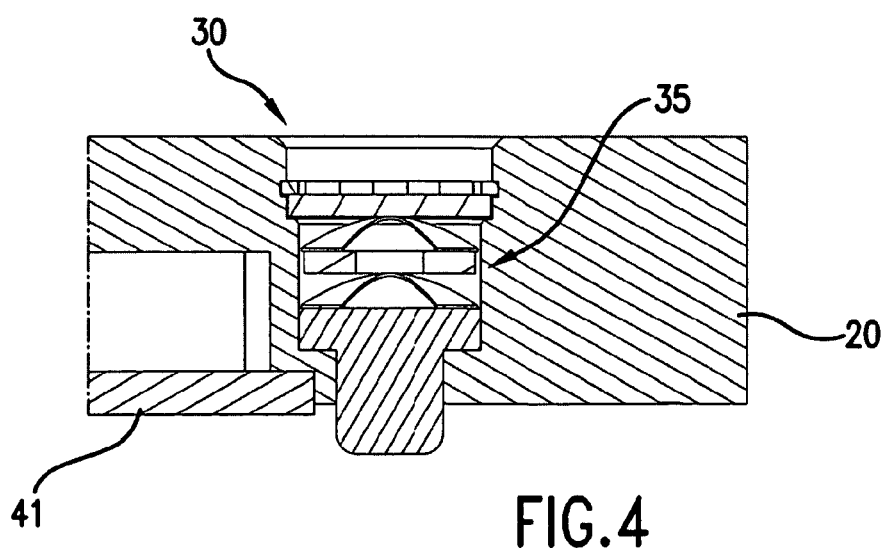
FIG. 4 is a cross sectional view of the spring mechanism of an embodiment of the invention.

FIG. 4 is a cross sectional view of the spring mechanism 30 of an embodiment of the invention shown in an uncompressed state or a state when the cold plate 20 is not coupled to the module. The spring mechanism 30 features spring loaded piston or plunger 35 designed to provide a method of separating the module from the cold plate 20 when removing the cold plate 20. High performance interfaces used in the prior art causes the module to adhere to the cold plate when removing the cold plate and there is potential for the module to dislodge and fall onto the board or the floor, causing damage to the module or the computer. Thus, in an embodiment of the invention, a dry thermal interface 41 is used which requires minimal care and handling and no clean up. The spring loaded plunger 35 is needed to ensure that the module remains on the board when the cold plate 20 is lifted away.

Figure 5:
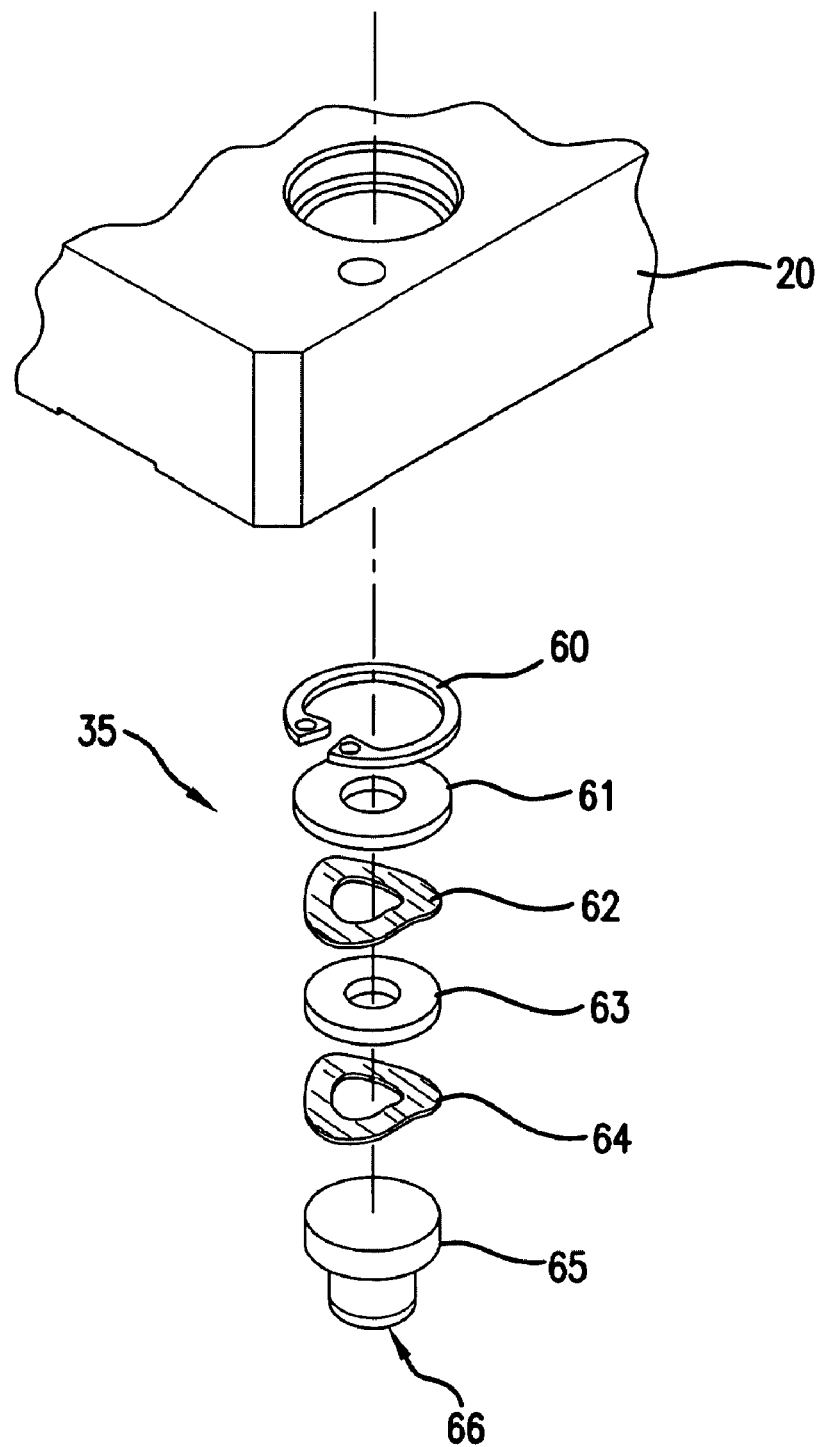
FIG. 5 is an exploded view of the spring mechanism of an embodiment of the invention.

An exploded view of the spring loaded plunger 35 is shown in FIG. 5. The spring loaded plunger 35 features a retaining ring 60, a washer lid 61, two washers 62 and 64, a washer valve 63 and a push pin 65. The washers 62 and 64 are in the form of springs. These washers 62 and 64 allow the upward and downward motion of the plunger 35. When the cold plate is compressed, that is, when the cold plate is in contact with the module, the bottom 66 of the push pin 65 is in flush contact with the module and the bottom 66 is aligned with the thermal interface 40. The push pin 65 presses against the interface surface of the module to the cooled. In an uncompressed state, the bottom 66 of the push pin 65 is not aligned with the thermal interface, as shown in FIG. 4.

The invention has been described in detail with particular reference to certain preferred embodiments thereof, but it will be understood that variations and modifications can be effected within the spirit and scope of the invention.

The invention claimed is:

1. A method of cooling a module attached to a board with multiple modules and multiple cold plates comprising:

providing a flexible supply tubing and a flexible return tubing fluidically connected to a cold plate on a fluid connecting side, wherein, the cold plate is coupled to the module with an actuation mechanism and comprises a thermal interface on a side opposite the fluid connecting side and a spring mechanism having a spring loaded plunger with a bottom; compressing the spring mechanism via tightening of the actuation mechanism during cooling such that the bottom of the spring loaded plunger is aligned with the thermal interface and is in direct contact with the module; and releasing the spring mechanism via a loosening of the actuation mechanism such that the bottom of the spring loaded plunger is not aligned with the thermal interface and separates the module from the cold plate when removing the cold plate.

\* \* \* \* \*